United States Patent
Simizu

(10) Patent No.: US 6,627,899 B2
(45) Date of Patent: *Sep. 30, 2003

(54) MAGNETIC LENSES, CHARGED-PARTICLE-BEAM OPTICAL SYSTEMS, AND CHARGED-PARTICLE-BEAM PATTERN-TRANSFER APPARATUS

(75) Inventor: Hiroyasu Simizu, Kawasaki (JP)

(73) Assignee: Nikon Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/320,199

(22) Filed: May 26, 1999

(65) Prior Publication Data

US 2002/0096644 A1 Jul. 25, 2002

(30) Foreign Application Priority Data

May 27, 1998 (JP) .......................................... 10-162926

(51) Int. Cl.[7] .............................................. H01J 37/141
(52) U.S. Cl. .............................................. 250/396 ML
(58) Field of Search ....................... 250/396 ML, 396 R

(56) References Cited

U.S. PATENT DOCUMENTS 3,851,172 A * 11/1974 Ozasa et al. ......... 250/396 ML
4,345,152 A * 8/1982 Gerlach ................ 250/396 ML
5,442,182 A * 8/1995 Kubo et al. .......... 250/396 ML

* cited by examiner

Primary Examiner—Kiet T. Nguyen
(74) Attorney, Agent, or Firm—Klarquist Sparkman LLP

(57) ABSTRACT

Magnetic lenses and coils for magnetic lenses, charged-particle-beam (CPB) optical systems and pattern-transfer apparatus comprising such magnetic lenses, and manufacturing methods for such lenses, systems, and apparatus are disclosed. In the coils for magnetic lenses, the number of coil turns per unit length is adjusted so that the axial magnetic field at the ends of the coils more closely approximates an ideal magnetic field. In another example, a coil for a magnetic lens comprises two or more subcoils. The currents in the subcoils or the products of current and coil turns for respective subcoils are adjusted to approximate a selected magnetic field, such as to correct or at least reduce magnetic field "droop" at the ends of the coil. Magnetic lenses including such coils and a yoke are provided as well as CPB pattern-transfer apparatus using these magnetic lenses.

17 Claims, 6 Drawing Sheets

MAGNETIC LENSES, CHARGED-PARTICLE-BEAM OPTICAL SYSTEMS, AND CHARGED-PARTICLE-BEAM PATTERN-TRANSFER APPARATUS

FIELD OF THE INVENTION

The disclosure pertains to charged-particle-beam (CPB) optical systems and CPB pattern-transfer apparatus as used in, e.g., CPB microlithography for manufacture of semiconductor devices such as integrated circuits and displays.

BACKGROUND

Charged-particle-beam (CPB) pattern-transfer apparatus have been developed to provide high-resolution pattern transfer for the manufacture of integrated circuits. CPB pattern-transfer apparatus offer higher resolutions than conventional visible-light or ultraviolet-light pattern-transfer apparatus. FIG. 4A illustrates a portion of a conventional CPB optical system for CPB pattern transfer. The system of FIG. 4A employs an electron beam EB as a charged particle beam. The electron beam EB is collimated upstream of a reticle 10 by a condenser lens (not shown). The collimated electron beam is directed to a region of the reticle 10 by field-of-view-selecting deflectors (not shown). The reticle 10 defines a pattern (usually a circuit pattern) to be transferred to a wafer 20 or other substrate termed generally a "wafer" herein. A first projection lens 30 and a second projection lens 40 form a-an image of the illuminated region of the reticle pattern on the wafer 20.

The projection lenses 30, 40 are magnetic lenses and comprise respective coils 45, 46 and yokes (magnetic pole pieces) 45a, 46a that are symmetric about an optical axis AX. The yokes 45a, 46a are made of iron or other magnetic material and have respective bores $G_1$, $G_2$ and $G_3$, $G_4$. The projection lenses 30, 40 are described with reference to an axial coordinate Z extending along the axis AX. The first projection lens 30 extends from an axial coordinate $Z_1$ to an axial coordinate $Z_3$, and the center of the projection lens 30 is at an axial coordinate $Z_2$. The second projection lens 40 extends from an axial coordinate $Z_4$ to an axial coordinate $Z_6$, and the center of the projection lens 40 is at an axial coordinate $Z_5$.

The coils 45, 46 of the projection lenses 30, 40, respectively, produce magnetic fields when energized by respective power supplies 47, 48. In some CPB optical systems, additional coils are provided inside the projection lenses 30, 40 to form supplemental magnetic fields for adjusting focal point, image rotation, and/or image magnification.

To increase throughput, CPB pattern-transfer apparatus are needed that expose larger wafer areas in each exposure while forming high resolution images. Improved magnetic lenses are important for high throughput CPB pattern-transfer.

SUMMARY OF THE INVENTION

The present invention provides, inter alia, CPB optical systems that exhibit lower aberrations. Such CPB optical systems comprise lens coils and yokes that provide a more abrupt decrease (i.e., less "droop") of the magnetic field at entrance and exit ends of the yoke. In specific embodiments, the more abrupt decrease of the magnetic field is produced without changing the yoke shape selected during the design of the lens.

Generally, according to the invention, coils for magnetic lenses are provided having an axis and a number of turns per unit length along the axis. The number of turns varies as a function of position along the axis. In a first representative embodiment, the coil has a first end and a central section, wherein the number of turns per unit length is greater in the first end than in the central section. Such a coil can have a second end in which the number of turns per unit length is greater than in the central section. In alternative embodiments, the coils are symmetric about the axis.

According to another representative embodiment, coils for magnetic lenses are provided, wherein an exemplary coil comprises an entrance subcoil situated on an axis. The coil has a number of turns per unit length of $N_{entrance}$. The coil also comprises a central subcoil, situated on the axis, that has a number of turns per unit length of $N_{central}$. The coil also comprises an exit subcoil, situated on the axis, that has a number of turns per unit length of $N_{exit}$. In specific embodiments, $N_{entrance}$ is greater than $N_{central}$, or $N_{exit}$ is greater than $N_{central}$, or both. At least one of the entrance subcoil, central subcoil, and exit subcoil can be symmetric about the axis.

According to another aspect of the invention, magnetic lenses are provided that include coils as described above and a yoke that surrounds the coil. According to an example embodiment, the magnetic lens comprises an entrance subcoil and a central subcoil. The subcoils are situated on an axis and have respective turns per unit length $N_{entrance}$ and $N_{central}$. According to a specific example, $N_{entrance}>N_{central}$.

The magnetic lens can comprise a power supply for the entrance subcoil and a separate power supply for the central subcoil. The power supply for the entrance subcoil establishes a respective Ampere-turn value for the entrance subcoil and the power supply for the central subcoil establishes a respective Ampere-turn value for the central subcoil. The Ampere-turn value of the central subcoil is desirably less than the Ampere-turn value of the entrance subcoil. The magnetic lens can comprise an exit subcoil situated on the axis and having a turns per unit length of $N_{exit}$, wherein $N_{exit}>N_{central}$.

According to yet another aspect of the invention, CPB optical systems are provided. A representative embodiment of such a system comprises at least one magnetic lens having an entrance subcoil, an exit subcoil, and a central subcoil. Each of the coils has a respective number of turns per unit length. The subcoils are energized such that a product of the turns per unit length and the current in at least one of the entrance and exit end subcoils is greater than a product of the turns per unit length and current in the central subcoil.

A CPB optical system according to the invention can be configured as first and second projection lenses for use in a CPB pattern-transfer apparatus. At least one of the first and second projection lenses comprises respective entrance, exit, and central subcoils, each subcoil having a selected number of turns per unit length. The number of turns per unit length of at least one of the entrance or exit subcoils is selected to be greater than the turns per unit length of the corresponding central coil. The projection lenses can include one or more power supplies that energize the subcoils. The power supply energizing the entrance or exit subcoil provides a greater number of Ampere-turns than the power supply that energizes the central subcoil.

The foregoing and other features and advantages of the invention will become more apparent from the following detailed description of embodiments which proceeds with reference to the accompanying drawings.

DETAILED DESCRIPTION

Figure 4A:
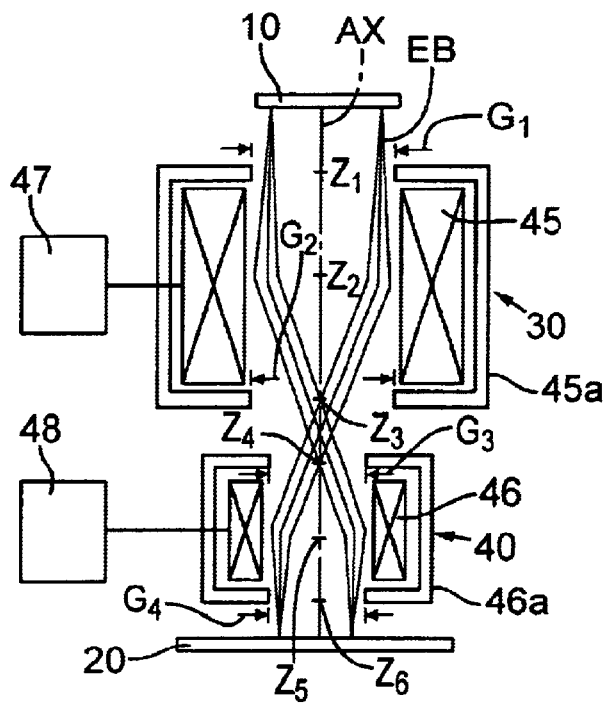
FIG. 4A is a schematic of a conventional charged-particle-beam optical system.
Figure 4B:
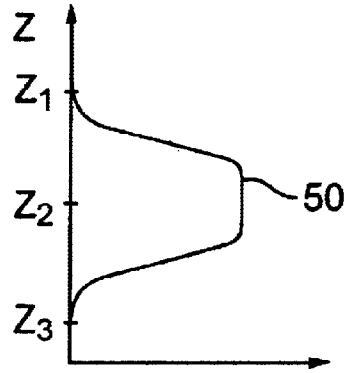
FIG. 4B is a graph of on-axis axial magnetic field for a projection lens of FIG. 4A.

In conventional CPB optical systems such as that of FIG. 4A, coils 45, 46 have uniform windings, in which the number of turns per unit length (measured along the axis AX) is constant. FIG. 4B shows a curve 50 that illustrates the on-axis axial component of the magnetic field H(Z) as a function of the axial coordinate Z. As shown in FIG. 4B, H(Z) gradually increases as Z varies from $Z_1$ to $Z_2$, is constant near $Z=Z_2$, and then decreases gradually from $Z_2$ to $Z_3$. The on-axis magnetic field H(Z) is not constant between $Z_1$ and $Z_3$ because the magnetic fields at the ends of the lens 30 (i.e., near $Z_1$ and $Z_3$) depend on the shape of the yoke 45a. Magnetic flux lines concentrate at the ends of the yoke 45a, and the axial magnetic field decreases gradually ("droops") near the ends.

Within each of the projection lenses 30, 40, the beam EB is focused by the respective magnetic field and is directed toward a focal point. In a paraxial approximation, the trajectory of a single charged particle of the electron beam EB beam in the absence of an electric field is described by:

$$r''(Z)+(e/8m)(B^2(Z)/\phi)r(Z)=0, \qquad (1)$$

wherein r(Z) is a radial distance of the charged particle from the axis AX, r''(Z) is the second derivative of r(Z) with respect to Z, e and m are the electrical charge and mass, respectively, of the charged particle, B(Z) is the axial component of the magnetic field, and $\phi$ is an acceleration voltage.

Figure 5A:
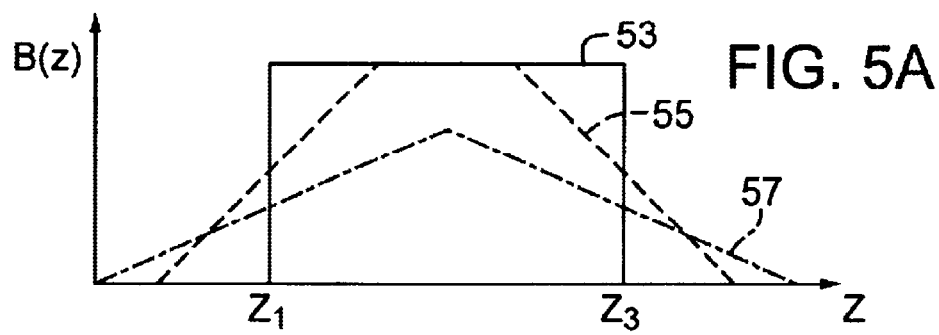
FIG. 5A contains graphs of the on-axis axial magnetic fields for an ideal projection lens and a non-ideal projection lens.
Figure 5B:
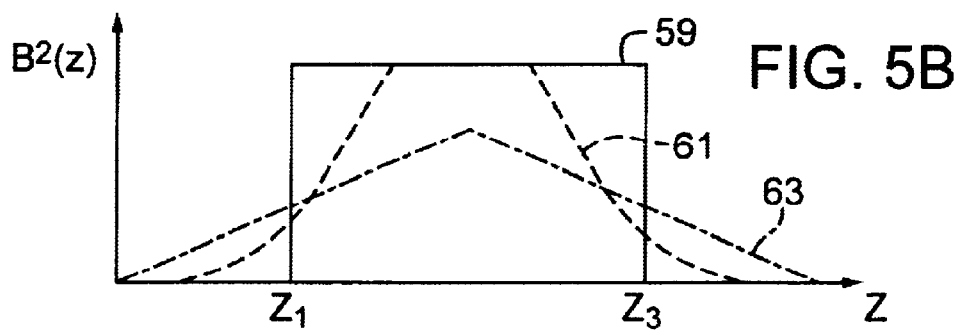
FIG. 5B contains graphs of the respective squares of the on-axis axial magnetic fields of FIG. 5A.

Equation 1 shows that the magnetic force on a charged particle of the beam EB is proportional to r(Z) and to the square of the magnetic field B(Z). The angular deviation of a charged particle is proportional to the product $r(Z) B^2(Z)$. FIG. 5A shows curves 53, 55 of the on-axis axial components of several magnetic fields B(Z). The curve 53 is for an ideal magnetic field that is constant between $Z_1$ and $Z_3$ and decreases abruptly to zero at $Z_1$ and $Z_3$. The curve 55 represents a non-ideal field that is similar to the curve 50 of FIG. 4B. FIG. 5B shows curves 59, 61 representing the square of the magnetic fields B(Z) corresponding to the curves 53, 55 respectively. Curve 57 in FIG. 5A and curve 63 in FIG. 5B represent the respective radial coordinates r(Z) of the charged particle.

The coils 45, 46 generate the magnetic fields associated with the projection lenses 30, 40. Thus, no magnetized materials or permanent magnets are used. Because of Ampere's law, the magnitudes of the respective axial magnetic fields produced by the lenses 30, 40 are proportional to the product of the electric currents in the respective coils 45, 46 and the number of turns of the respective coils 45, 46. The product of the number of turns in a coil and the current in the coil is referred to as the number of Ampere-turns of the coil, or simply at the "Ampere-turns" of the coil.

The inventors of the present application have observed that the ideal magnetic field produces a magnetic force that is larger because of the dependence of the magnetic force on r, as shown in Equation 1. For the same excitation, the ideal magnetic field provides a greater focusing effect than the non-ideal magnetic field. Therefore, the ideal magnetic field permits a smaller excitation. In addition, because aberrations of a magnetic lens depend on the magnitude of the magnetic field, the ideal magnetic field of curve 53 exhibits lower aberrations.

Projection lenses are typically designed by selecting a maximum CPB deflection and ten selecting a yoke having an inside diameter that permits acceptable amounts of aberration. A yoke bore is then selected, and coil dimensions are determined based on the yoke bore.

Improved throughput is especially important for practical CPB pattern-transfer apparatus. To increase throughput, larger wafer areas are exposed in each exposure and the CPB is deflected through larger angles. The larger irradiated areas and the increased deflection angles require larger-diameter lenses, causing the axial magnetic field at the ends of the lenses to decrease even more gradually (i.e., increasing the droop in the axial magnetic field) and increasing the lens aberrations.

Figure 1A:
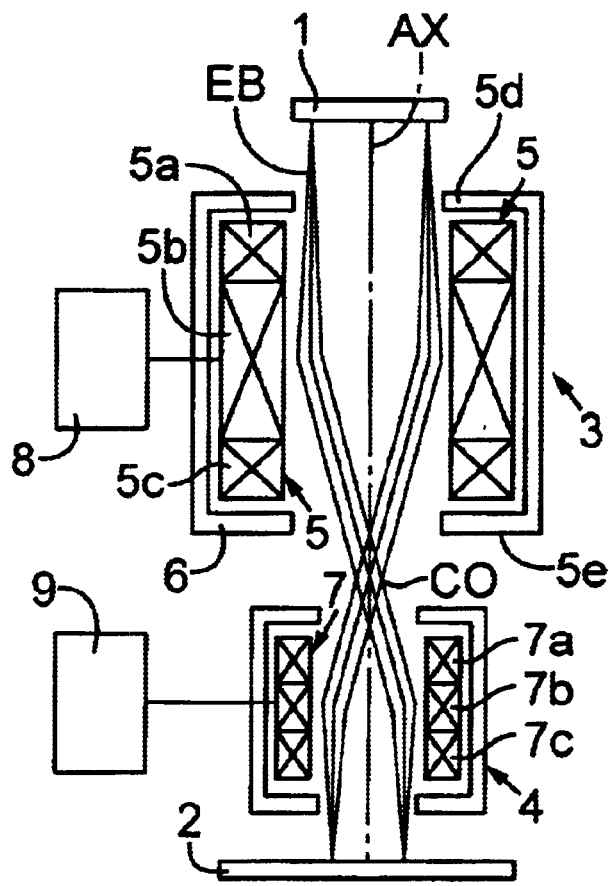
FIG. 1A is a schematic of a charged-particle-beam (CPB) projection-optical system according to a first example embodiment.

FIG. 1A shows a CPB optical system according to a first example embodiment of the invention. A charged particle beam EB (e.g., an electron beam) produced by a CPB source (not shown, but understood to be upstream of the components shown in FIG. 1A) is collimated by a condenser lens (not shown, but understood to be situated downstream of the CPB source) and directed onto a region of a reticle 1 with field-of-view-selecting deflectors (not shown, but understood to be upstream of the reticle 1). The reticle 1 defines a pattern (typically a circuit pattern) to be transferred to a wafer 2. The beam EB is transmitted by the reticle 1, and a first projection lens 3 and a second projection lens 4 form an image of the reticle pattern on the wafer 2.

The first projection lens 3 is a magnetic lens that comprises a coil 5 and a yoke 6 (i.e., a magnetic pole piece) that are symmetric about an axis AX. The yoke 6 is conveniently made of iron, but other magnetic materials are also suitable. The coil 5 comprises subcoils 5a, 5b, 5c that include respective coil windings having respective numbers of turns $N_{5a}$, $N_{5b}$, $N_{5c}$ per unit length that can vary along the axis AX, i.e., $N_{5a}$, $N_{5b}$, $N_{5c}$ are functions of the axial coordinate Z. The turns per unit length $N_{5a}$, $N_{5c}$ for the subcoils 5a, 5c, respectively, are greater toward an entrance end 5d and an exit end 5e of the first projection lens 3, and are greater than the turns per unit length $N_{5b}$ of the central subcoil 5b. The first projection lens 3 produces a magnetic field when energized by an electrical current from a power supply 8 connected to the subcoils 5a, 5b, 5c. The current in a coil or subcoil, the turns per unit length, and the total number of turns determine the magnitude of the respective magnetic field produced by the coil or subcoil. Because $N_{5a}$, $N_{5c}$ are greater than $N_{5b}$, the magnetic field produced by the subcoils 5a, 5c can be greater than the magnetic field produced by the central subcoil 5b, even if the subcoils 5a, 5b, 5c are energized by a single series current. Alternatively, different respective currents can be individually provided to the subcoils 5a, 5b, 5c.

Figure 1B:
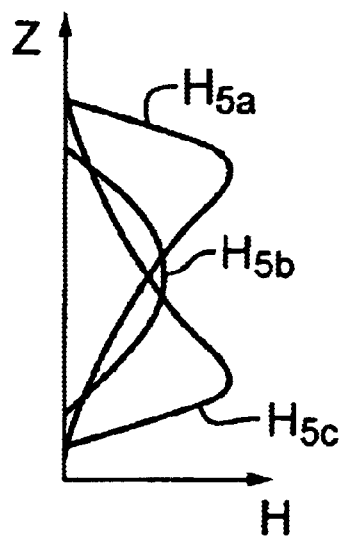
FIG. 1B is a graph of the on-axis axial magnetic fields for subcoils of one of the projection lenses shown in FIG. 1A.
Figure 1C:
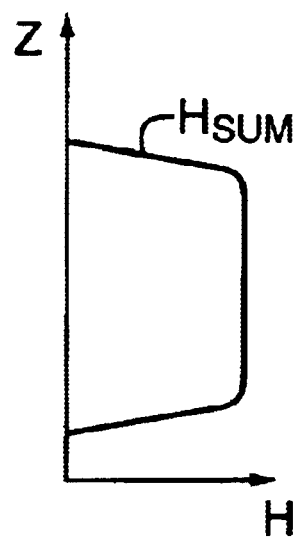
FIG. 1C is a graph of the total on-axis axial magnetic field, obtained by summing the magnetic fields of FIG. 1B.

FIG. 1B shows the on-axis axial component of the respective magnetic field H(Z) produced by each of the subcoils 5a, 5b, 5c (the fields being denoted by curves $H_{5a}$, $H_{5b}$, $H_{5c}$, respectively). The respective maximum on-axis axial magnetic fields produced by the subcoils 5a; 5c are larger than the maximum on-axis axial magnetic field produced by the subcoil 5b. The slopes of the curves $H_{5a}$, $H_{5b}$, $H_{5c}$ differ at the entrance end 5d and the exit end 5e because of the different locations of the subcoils 5a, 5b, 5c. For example, the curve $H_{5b}$ for the central subcoil is symmetric, but the curves $H_{5a}$, $H_{5c}$ are not. The sum of the magnetic fields corresponding to the curves $H_{5a}$, $H_{5b}$, $H_{5c}$, is the total on-axis axial magnetic field for the first projection lens 3, and is shown in FIG. 1C as a curve $H_{sum}$.

The respective on-axis axial magnetic fields produced by the subcoils 5a, 5c are selected so that the total axial magnetic field decreases more abruptly at the ends 5d, 5e of the lens 3 (i.e., the total axial magnetic field exhibits less "droop" than the field produced by a conventional magnetic lens). The on-axis axial magnetic fields of the subcoils 5a, 5c can be selected so that the total magnetic field $H_{sum}$ more closely approximates the ideal on-axis axial magnetic field (i.e., the rectangular shape of curve 53 shown in FIG. 5A). In addition, because each respective axial magnetic field is more similar to the ideal axial magnetic field, weaker magnetic fields can be used, thereby reducing aberrations.

The dimension of the second projection lens 4 differs from the dimension of the first projection lens, but the projection lens 4 can be similar to the projection lens 3. For example, the coil 7 can comprise subcoils 7a, 7b, 7c, and the number of turns $N_{7a}$, $N_{7b}$, $N_{7c}$ for the respective subcoils can be chosen so that each of $N_{7a}$ and $N_{7c}$ is greater than $N_{7b}$. Alternatively, the lens 4 can have a conventional configuration.

Figure 2A:
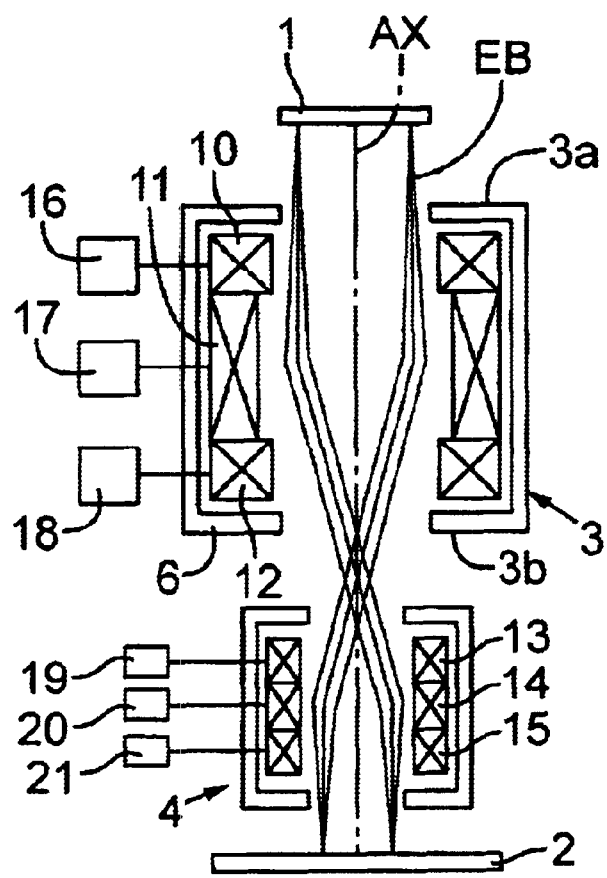
FIG. 2A is a schematic diagram of a CPB projection-optical system according to a second example embodiment.
Figures 2B, 2C:
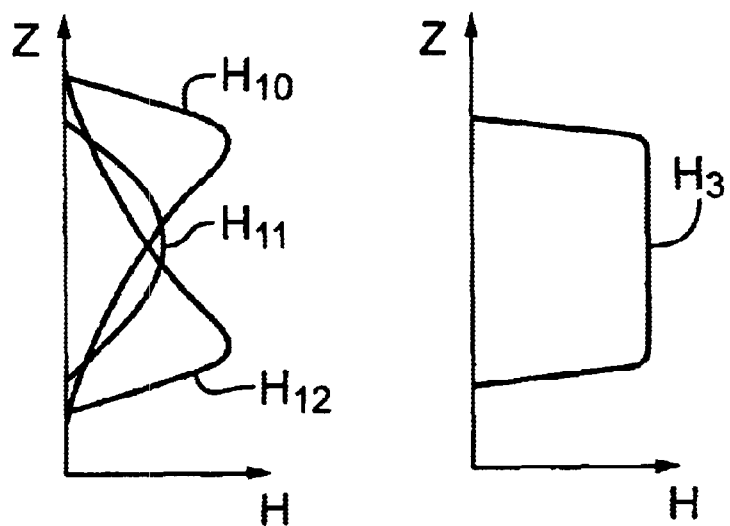
FIG. 2B is a graph of the on-axis axial magnetic fields for subcoils of one of the projection lenses shown in FIG. 2A.
FIG. 2C is a graph of the total on-axis axial magnetic field, obtained by summing the magnetic fields of FIG. 2B.

FIG. 2A shows a CPB optical system according to a second example embodiment. A first projection lens 3 comprises an entry subcoil 10, a central subcoil 11, and an exit subcoil 12, all of which can be different. Respective power supplies 16, 17, 18 supply current to the respective subcoils 10, 11, 12. FIG. 2B shows axial components of the respective magnetic fields as a function of axial position Z (i.e., H(Z)) for the subcoils 10, 11, 12 (the magnetic fields are plotted as respective curves $H_{11}$, $H_{12}$, $H_{13}$). The maximum respective magnetic field produced by each of the entry subcoil 10 and the exit subcoil 12 is greater than the maximum magnetic field produced by the central subcoil 11. The respective numbers of windings of the subcoils 10, 11, 12 and/or the respective currents in the subcoils 10, 11, 12 can be adjusted to produce the magnetic fields shown in FIG. 2B. In one embodiment, a single power supply (such as the power supply 18) provides a series current to the subcoils 10, 11, 12. In any event, the total on-axis axial component of magnetic field is the sum of the respective axial magnetic fields represented by curves $H_{10}$, $H_{11}$, $H_{12}$, and is shown in FIG. 2C as a curve $H_3$.

The respective individual axial magnetic fields produced by the subcoils 10, 12 can be adjusted to be larger than the axial magnetic field produced by the central subcoil 11 so that the magnetic field near ends 3a, 3b of the subcoils 10, 12, respectively, decreases more abruptly (i.e., exhibits less droop), and $H_3$ more closely approximates the ideal magnetic field, thereby reducing aberrations.

In the embodiment of FIG. 2A, the dimension of the second projection lens 4 differs from that of the first projection lens, but the first projection lens and the second projection lens 4 can be similar. The second projection lens 4 comprises an exit subcoil 14, an exit subcoil 15, and a central subcoil 14. The subcoils 13, 14, 15 are energized by respective power supplies 19, 20, 21, and the total axial component of magnetic field produced by the subcoils 13, 14, 15 can more closely approximate the ideal magnetic field.

Figure 2D:
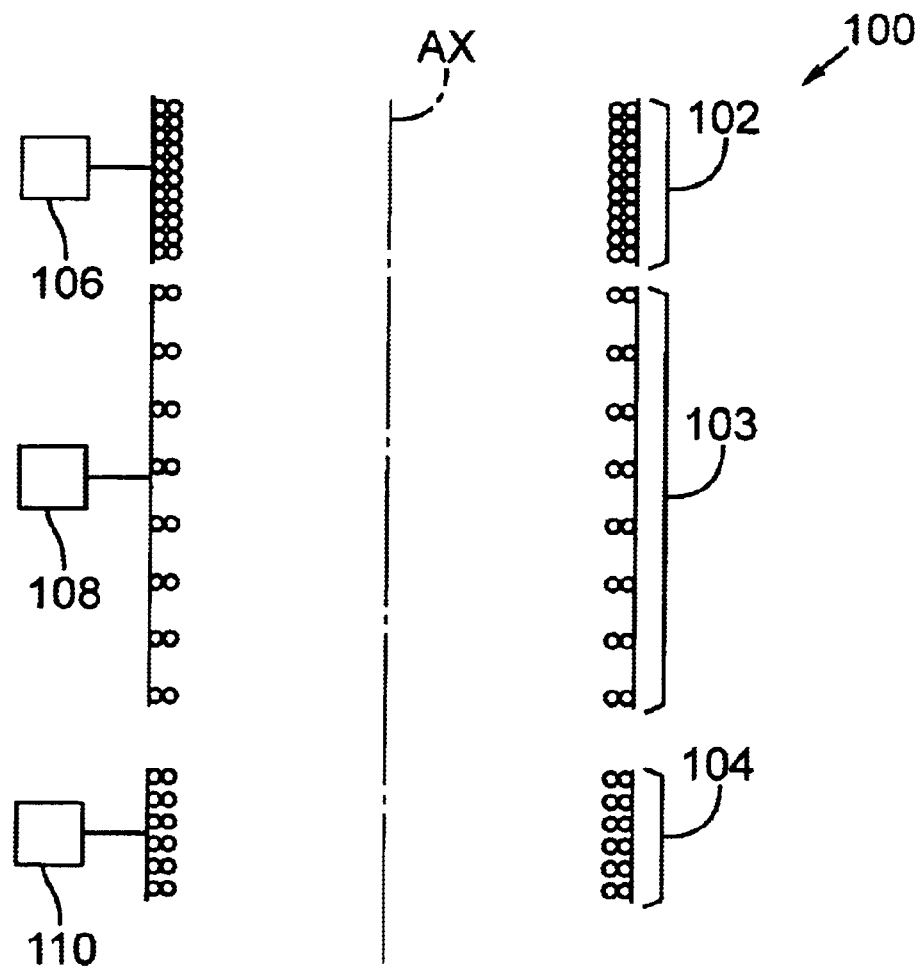
FIG. 2D is a schematic depiction of a representative coil for a magnetic lens.

FIG. 2D is a vertical sectional view of a coil 100 according to the invention for a magnetic lens. The coil 100 is situated on an axis AX and comprises end subcoils 102, 104 and a central subcoil 103. The subcoils 102, 103, 104 include turns per unit length of N102, N103, N104, respectively. As illustrated in FIG. 5, each of N102 and N104 is greater than N103, and N102 is greater than N103. The subcoils 102, 103, 104 are energized by respective power supplies 106, 108, 110. The coil 100 can be configured to produce an axial magnetic field that more closely approximates the ideal axial magnetic field than a conventional coil. The respective currents from the power supplies 106, 108, 110 and the respective numbers of turns N102, N103, N104 per unit length (as well as the total number of turns in each of the subcoils 102, 103, 104) can be independently selected, or, for convenience, the numbers of turns of two or more of the subcoils 102, 103, 104 can be selected so that a single power supply can be used to energize two or more of the subcoils 102, 103, 104.

Figure 2E:
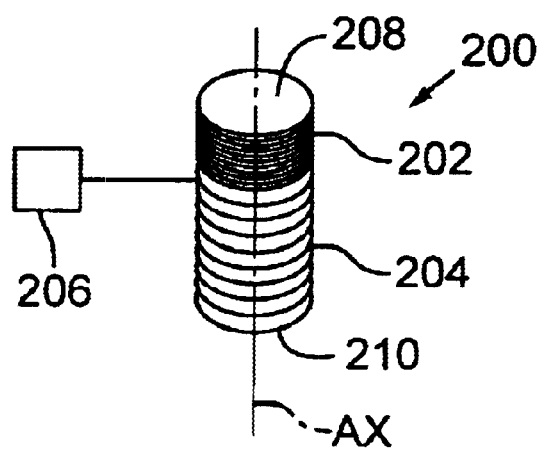
FIG. 2E is a perspective view of a representative coil for a magnetic lens.

FIG. 2E is a perspective view of a coil 200 according to the invention for a magnetic lens or deflector. The coil 200 comprises an end section 202 and a central section 204. The end section 202 and the central section 204 are collectively energized by a series current from a power supply 206. The end section 202 and the central section 204 have turns per unit length of $N_{202}$, $N_{204}$, respectively, that are selectable to reduce droop in the axial magnetic field produced by the coil 200 near a first end 208 of the coil 200. The coil 200 can be configured at a second end 210 to reduce magnetic field droop at the second end 210 as well.

Figure 3:
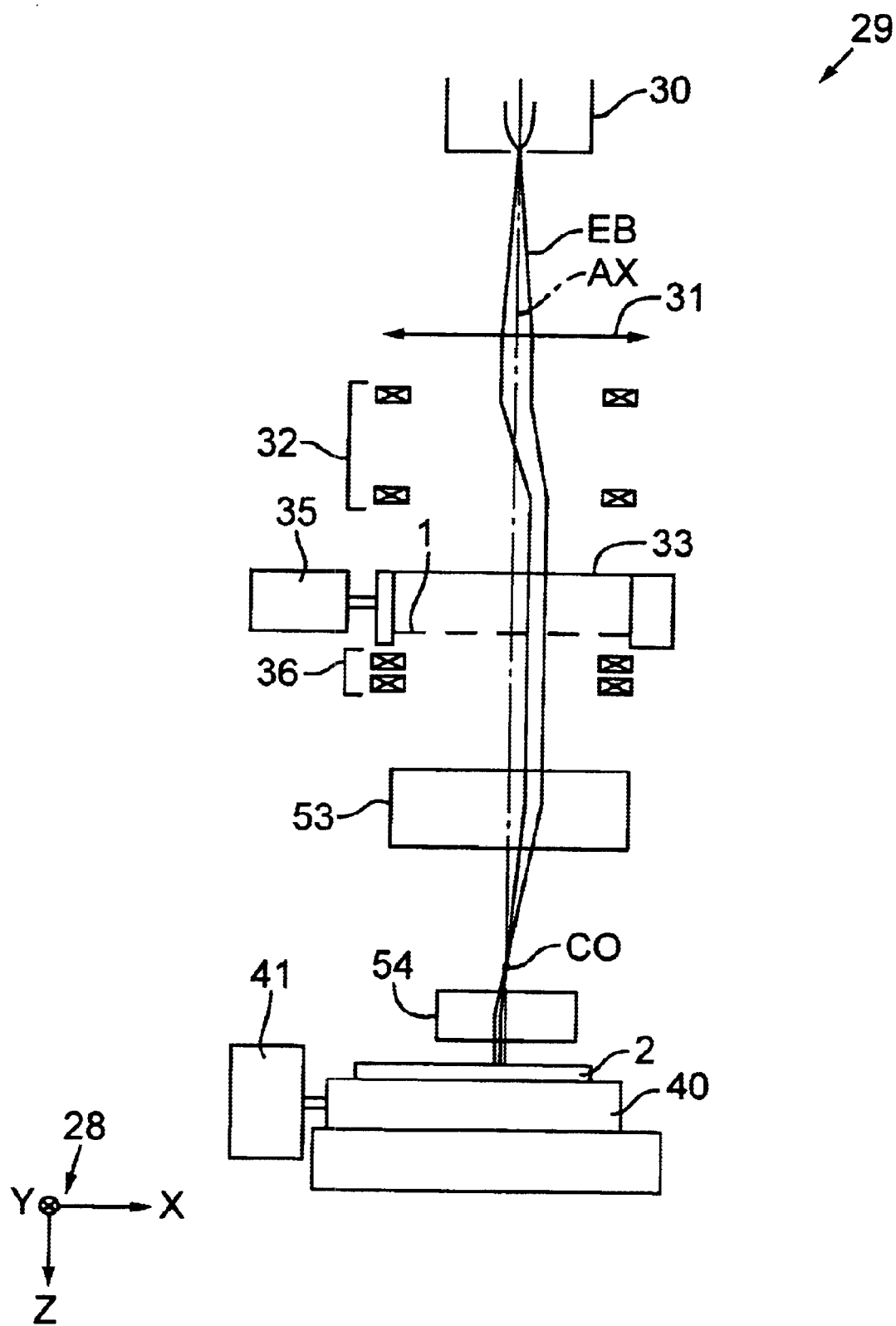
FIG. 3 is a schematic diagram of a CPB pattern-transfer apparatus according to an example embodiment.

FIG. 3 shows a CPB pattern-transfer apparatus 29 according to the invention that comprises projection lenses 53, 54. The CPB pattern-transfer apparatus 29 is described with reference to a coordinate axis 28. A condenser lens 31 collimates an electron beam EB (as a representative charged particle beam) produced by an electron gun 30. A field-of-view selecting deflector 32 deflects the electron beam EB within an XY-plane that is perpendicular to an axis AX. The deflector 32 is controlled to selectively irradiate a region ("field") of the reticle 1. A reticle stage 33 retains the reticle 1 in a plane parallel to the XY-plane. A reticle-stage driver 35 controls stepwise movements of the reticle stage 33 in the X-axis direction and continuous movements of the reticle stage 33 in the Y-axis direction. The reticle 1 defines a pattern corresponding to, e.g., a circuit pattern to be transferred to a wafer 2. The electron beam EB is transmitted by the reticle 1 and is deflected by a deflector 36. An image of the irradiated region of the reticle 1 is projected onto a predetermined location on the wafer 2 by the first projection lens 53 and the second projection lens 54 at a specified magnification. A wafer stage 40 retains the wafer 2 in a plane parallel to the XY-plane. A wafer-stage driver 41 moves the wafer stage 40 continuously in a direction opposite the Y-axis direction in which the reticle stage 33 is moved continuously by the reticle-stage driver 35. These motions are in opposite directions because the projection lenses 53, 54 form an inverted image of the field on the wafer 2.

At least one of the first projection lens 53 and the second projection lens 54 can be a lens as described above with reference to FIGS. 1A–1C and FIGS. 2A–2C. With such a lens, the droop of the axial magnetic field at the ends of the lenses is reduced so that the axial magnetic field better approximates an ideal (uniform) magnetic field with abrupt decreases of the magnetic field at the ends. In addition, at least one of the projection lenses 53, 54 can be configured to reduce the droop in the axial magnetic field at the entrance or exit of the respective lens.

In the examples discussed above, the respective axial magnetic fields of projection lenses 3, 4 are made to decrease more abruptly at ends of the projection lenses 3, 4 by providing increased numbers of turns per unit length for coils or subcoils situated at either an exit end or an entrance end, or both ends, of the projection lenses 3, 4. Alternatively, higher currents can be used to excite subcoils situated near the entrance end or the exit end, or both ends, of the lenses 3, 4. Such coils and subcoils are simple to manufacture, and it is easy to vary the magnetic fields of the coils and subcoils to approximate a selected magnetic field. Adjustments can be made readily after the lens is manufactured or installed in a CPB pattern-transfer apparatus.

The terms "entrance end" and "exit end" are used with respect to the subcoils for convenience only. For example, a charged particle beam can propagate either from the subcoil on the entrance end to the subcoil on the exit end, or from the subcoil on the exit end to the subcoil on the entrance end. The coils and subcoils can have cross-sections having any of various shapes, including circular, square, rectangular, trapezoidal, elliptical, triangular, or irregular shapes. The coil cross-sections need not be symmetric about the optical axis.

Figure 6:
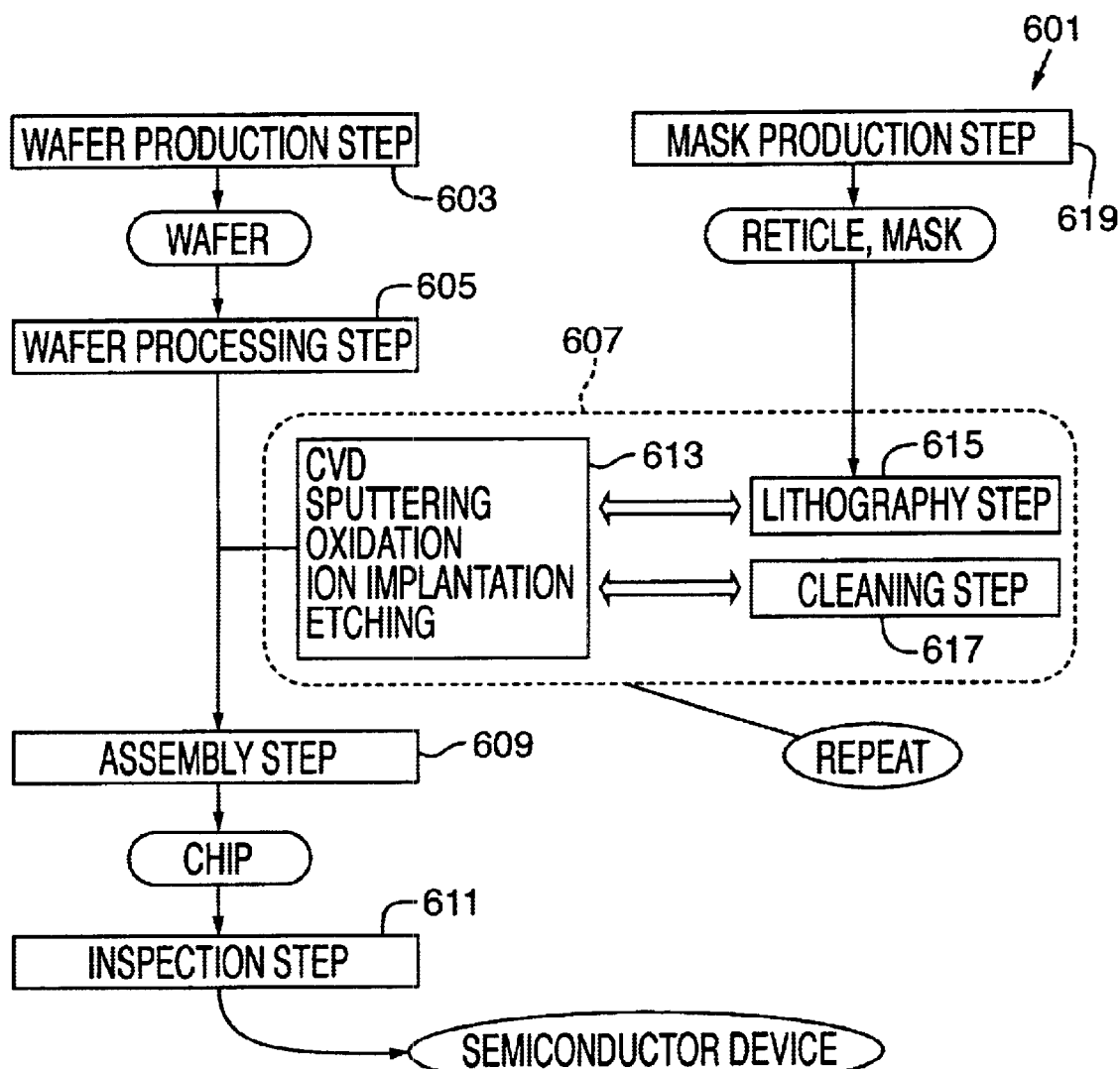
FIG. 6 is a schematic block diagram of a semiconductor manufacturing method.

With reference to FIG. 6, a semiconductor-manufacturing method 601 includes a wafer-preparation step 603, a wafer-processing step 605, an assembly step 609, and an inspection step 611. Each of these steps can include one or more process steps.

The wafer-processing step 605 includes a wafer-patterning step 607 in which circuit patterns are defined on the wafer. The wafer-patterning step 607 includes a material deposition/removal step 613 in which materials are deposited on the wafer or removed from the wafer, a lithography step 615 that defines the circuit patterns on the wafer, and a cleaning step 617. The material-deposition/removal step 613 can include processes such as chemical vapor deposition (CVD), sputtering, surface oxidation, ion implantation, and etching.

Figure 7:
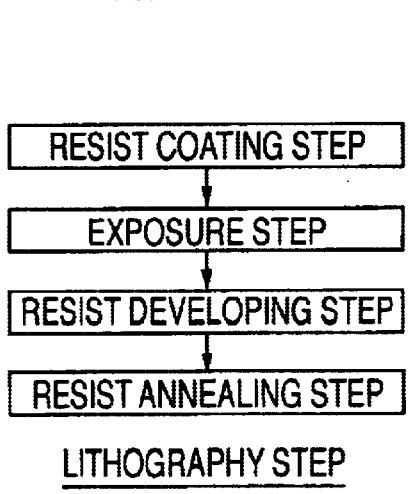
FIG. 7 is a schematic block diagram of the lithographic step of the method of FIG. 6.

The lithography step 615 is illustrated in FIG. 7. The lithography step 615 defines the circuit patterns on the wafer and includes the steps of applying a layer of a resist to the wafer, projecting patterns from a mask or reticle onto the wafer to expose the resist, developing the resist, and annealing the resist. After development, a material can be applied so that wafer areas that are no longer covered by the resist receive the material, or, if an etching process is used, the exposed areas are unprotected by the resist and can be etched. After the patterns defined in the resist are transferred to the wafer, the resist layer is removed (stripped) from the wafer in the cleaning step 617. If additional patterns are needed to define the circuit, this process is repeated until the complete circuit pattern is transferred.

The circuit patterns are generally defined using a mask or reticle that is produced in a mask-production step 619. Patterns are transferred from a mask or reticle to a wafer by illuminating the mask with a charged particle beam and projecting a pattern defined by the mask onto a surface of the wafer.

After the circuit patterns have been defined on the wafer, the wafer can be diced into multiple devices and packaged. Generally, the devices are inspected for defects in the inspection step 611.

The resolution of the lithography step 615 generally limits the feature size in the circuit patterns transferred to the wafer. The magnetic coils and magnetic lenses described above can be used in the lithography step 615 to provide high-resolution pattern transfer. In addition, these magnetic coils and lenses can be used to increase throughput, to improve pattern resolution, and to lower the cost of semiconductor-device production.

Whereas the invention has been described in connection with multiple example embodiments, it will be understood that the invention is not limited to those embodiments. On the contrary, the invention is intended to encompass all alternatives, modifications, and equivalents as may be included within the spirit and scope of the invention as defined by the appended claims.

What is claimed is:

1. A magnetic lens, comprising:
    a lens coil situated on an axis and having an input end and an output end, wherein the lens coil is configured to produce a maximum axial magnetic field component;
    an output end coil situated at the output end of the lens coil, the output end coil having at least one of a Ampere-turns per unit length and a number of turns per unit length configured to produce a maximum axial magnetic field component that is greater than the maximum axial magnetic field component produced by the lens coil; and
    an input end coil situated at the input end of the lens coil, the input aid coil having at least one of a Ampere-turns per unit length and a number of turns per unit length configured to produce a maximum axial magnetic field component that is greater that the maximum axial magnetic field component produced by the lens coil.

2. A magnetic lens, comprising a singe lens coil situated on an axis, the single lens coil having a central section, an input end, and an output end, wherein the input end and the output end each have a respective at least one of an Ampere-turns per unit length and a number of turns per unit length configured to produce respective maximum axial magnetic field components that are greater that a maximum axial magnetic field component produced by the central section.

3. A magnetic lens, comprising a single coil having an axis and configured to be energized so that an Ampere-turns per unit length of the single coil is variable along the axis, the single coil comprising a first end and a central section, wherein the Ampere-turns per unit length is greater in the first end than in the central section.

4. The magnetic lens of claim 3, wherein the single coil further comprises a second end, and the Ampere turns per unit length is greater in the second end than in the central section.

5. The magnetic lens of claim 3, wherein the single coil is symmetric about the axis.

6. The magnetic lens of claim 3, further of comprising a yoke surrounding the single coil.

7. A charged-particle-beam pattern-transfer apparatus, comprising a magnetic lens as recited in claim 3.

8. A magnetic lens, comprising:
   an entrance subcoil situated on an axis and having a number of turns per unit length $N_{entrance}$;
   a central subcoil situated on an axis and having a number of turns per unit length $N_{central}$, wherein $N_{entrance} > N_{central}$; and
   an exit subcoil situated on an axis and having a number of turns per unit length $N_{exit}$, wherein $N_{exit} > N_{central}$.

9. The magnetic lens of claim 8, further comprising:
   a power supply for the entrance subcoil configured to establish an Ampere-turns per unit length of the entrance subcoil; and
   a power supply for the central subcoil configured to establish an Ampere-turns per unit length for the central subcoil, wherein the Ampere-turns per unit length of the central subcoil is less than the Ampere-turns per unit length of the entrance subcoil.

10. The magnetic lens of claim 9, further comprising a power supply for the exit subcoil configured to establish an Ampere-turns per unit length of the exit subcoil, wherein the Ampere-turns per unit length of the central subcoil is less than the Ampere-turns per unit length of the exit subcoil.

11. The magnetic lens of claim 8, further comprising:
   a power supply for exit subcoil configured establish en Ampere-turns per unit length of the exit subcoil; and
   a power supply for the central subcoil configured to establish an Ampere-turns per unit length for the central subcoil, wherein the Ampere-turns per unit length of the central subcoil is less than the Ampere-turns per unit length of the exit subcoil.

12. The magnetic lens of claim 8, wherein the entrance subcoil, the central subcoil, and the exit subcoil are configured to be energized by a common series current.

13. The magnetic lens of claim 8, further comprising a yoke surrounding the entrance subcoil, the central subcoil, and the exit subcoil.

14. A charged-particle-beam pattern-transfer apparatus, comprising a magnetic lens as recited in claim 8.

15. A magnetic lens, comprising:
   a magnetic yoke situated on an axis and having an entrance end and an exit end;
   an entrance coil situated on the axis within the magnetic yoke at the entrance end of the magnetic yoke, the entrance coil having a number of turns per unit length $N_{entrance}$;
   a central coil situated on the axis within the magnetic yoke adjacent the entrance coil, the central coil having a number of turns per unit length $N_{central}$; and
   an exit coil situated on to axis, within the magnetic yoke adjacent the central coil at the exit end of the magnetic yoke, the exit coil having a number of turns per unit length $N_{exit}$, wherein $N_{entrance} > N_{central}$ and $N_{exit} > N_{central}$.

16. The magnetic lens of claim 15, wherein the entrance coil, the central coil, and the exit coil are configured to be energized with a common series current.

17. A magnetic lens, comprising:
   a magnetic yoke situated on an axis and having an entrance end and an exit end;
   an entrance coil situated on the axis within the magnetic yoke at the entrance end of the magnetic yoke;
   a central coil situated en the axis within the magnetic yoke adjacent the entrance coil;
   an exit coil situated on the axis within the magnetic yoke adjacent the central coil at the an exit end of the magnetic yoke, wherein the entrance coil and the exit coil are configured to be energized to have respective Ampere-turns per unit length that are greater than an Ampere-turns per unit length of the central coil.

* * * * *

UNITED STATES PATENT AND TRADEMARK OFFICE
CERTIFICATE OF CORRECTION

PATENT NO. : 6,627,899 B2
DATED : September 30, 2003
INVENTOR(S) : Hiroyasu Simizu It is certified that error appears in the above-identified patent and that said Letters Patent is hereby corrected as shown below:

Column 1,
Line 30, "a-an" should be -- an --.

Column 3,
Line 57, "EB beam in" should be -- EB in --.

Column 4,
Line 22, "simply at the" should be -- simply as the --.
Line 34, "ten" should be -- then --.

Column 5,
Line 21, "5a;" should be -- 5a, --.

Column 6,
Line 2, "magnetic field" should be -- the magnetic field --.
Line 16, "exit subcoil 14," should be -- entry subcoil 13, --.

Column 8,
Line 65, "Ampere turns" should be -- Ampere-turns --.

Column 9,
Line 3, "further of comprising" should be -- further comprising --.
Lines 31-32, "for exit subcoil confirgured established en Ampere-turns" should be -- for the exit subcoil configured to establish an Ampere-turns --.

UNITED STATES PATENT AND TRADEMARK OFFICE
CERTIFICATE OF CORRECTION

PATENT NO. : 6,627,899 B2
DATED : September 30, 2003
INVENTOR(S) : Hiroyasu Simizu It is certified that error appears in the above-identified patent and that said Letters Patent is hereby corrected as shown below:

<u>Column 10,</u>
Line 17, "onto axis" should be -- on the axis --.
Line 31, "en the axis" should be -- on the axis --.
Line 34, "at the an exit end" should be -- at the exit end --.

Signed and Sealed this

Twenty-fourth Day of February, 2004

JON W. DUDAS
*Acting Director of the United States Patent and Trademark Office*